(12) United States Patent
Wang et al.

(10) Patent No.: US 7,642,222 B1
(45) Date of Patent: *Jan. 5, 2010

(54) METHOD FOR IMPROVING PERFORMANCE OF HIGH TEMPERATURE SUPERCONDUCTORS WITHIN A MAGNETIC FIELD

(75) Inventors: Haiyan Wang, Los Alamos, NM (US); Stephen R. Foltyn, Los Alamos, NM (US); Boris A. Maiorov, Los Alamos, NM (US); Leonardo Civale, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 622 days.

This patent is subject to a terminal disclaimer.

(21) Appl. No.: 11/001,462

(22) Filed: Nov. 30, 2004

(51) Int. Cl.
*H01B 12/00* (2006.01)
*H01L 39/00* (2006.01)

(52) U.S. Cl. .................. 505/237; 505/238; 428/701; 428/702; 29/599; 174/125.1

(58) Field of Classification Search .......... 505/100, 505/230, 235–239, 470–745; 428/689, 698, 428/699, 701, 930; 427/294–295, 62; 117/84, 117/9; 29/599
See application file for complete search history.

(56) References Cited

U.S. PATENT DOCUMENTS

| 4,994,435 | A  | * | 2/1991 | Shiga et al. ............. 505/232 |
| 6,451,450 | B1 | * | 9/2002 | Goyal et al. ............ 428/629 |
| 6,716,545 | B1 |   | 4/2004 | Holesinger et al. |
| 6,716,795 | B2 | * | 4/2004 | Norton et al. ........... 505/238 |
| 6,756,139 | B2 | * | 6/2004 | Jia et al. ................. 428/701 |
| 2002/0073918 | A1 |   | 6/2002 | Reade et al. |
| 2003/0036483 | A1 |   | 2/2003 | Arendt et al. |
| 2003/0054105 | A1 | * | 3/2003 | Hammond et al. ....... 427/294 |
| 2005/0159298 | A1 | * | 7/2005 | Rupich et al. ............ 502/100 |

OTHER PUBLICATIONS

Wang et al, "Microstructure of SrTiO3 buffer layers and its effects on superconducting properties of YBa2Cu3O7-d coated conductors,": J. Mater. Res. Jun. 2004, V 19, No. 6, pp. 1869-1875.*

Nie et al., "Evidence for c-axis Correlated Vortex Pinning in $Yba_2Cu_3O_7$-δ Films on Sapphire Buffered with an Atomically Flat $CeO_2$ Layer having a High Density of Nanodots," Supercond. Sci. Technol. 17 (2004) 845-852.

(Continued)

*Primary Examiner*—Stanley Silverman
*Assistant Examiner*—Kallambella Vijayakumar
(74) *Attorney, Agent, or Firm*—Bruce H. Cottrell; Juliet A. Jones

(57) ABSTRACT

The present invention provides articles including a base substrate including a layer of an oriented cubic oxide material having a rock-salt-like structure layer thereon; and, a buffer layer upon the oriented cubic oxide material having a rock-salt-like structure layer, the buffer layer having an outwardly facing surface with a surface morphology including particulate outgrowths of from 10 nm to 500 run in size at the surface, such particulate outgrowths serving as flux pinning centers whereby the article maintains higher performance within magnetic fields than similar articles without the necessary density of such outgrowths.

23 Claims, 4 Drawing Sheets

OTHER PUBLICATIONS

Crisan et al., "Sputtered Nanodots: A Costless Method for Inducing Effective Pinning Centers in Superconducting Thin Films," Appl. Phys. Lett., vol. 79, No. 27, Dec. 31, 2001.

Matsumoto et al., "Enhancement of Critical Current Density of YBCO Films by Introduction of Artificial Pinning Centers Due to the Distributed Nano-Sealed $Y_2O_3$ Islands on Substrates," Physica C 412-414 (2004) 1267-1271.

Hujibregtse et al., "Natural Strong Pinning Sites in Laser-Ablated $Yba_2Cu_3O_{7-\delta}$ Thin Films," Physical Review B, vol. 62, No. 2, Jul. 1, 2000.

* cited by examiner

METHOD FOR IMPROVING PERFORMANCE OF HIGH TEMPERATURE SUPERCONDUCTORS WITHIN A MAGNETIC FIELD

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to high temperature superconducting thick films and more particularly to improvement of their performance within magnetic fields.

BACKGROUND OF THE INVENTION

High temperature superconducting (HTS) materials such as $YBa_2Cu_3O_{7-\delta}$ (YBCO) are rapidly approaching the manufacturing stage in the form of flexible tapes known as coated conductors. This material will be used in a range of electric power applications such as magnets, motors, generators, and transformers. Although YBCO is capable of supporting very high current densities without resistance, this capability rapidly diminishes in the presence of a magnetic field. As most of the potential applications involve magnetic fields, supercurrent levels would be diminished unless this can be overcome. Ultimately, this phenomenon adversely impacts the cost/performance ratio of HTS products thereby raising the barrier to their commercialization.

Numerous investigations have been undertaken, all seeking to address this problem. Each has involved the same basic approach, i.e., to increase the number of flux-pinning defects within the YBCO superconductor material. Flux pinning refers to the ability of imperfections in the superconductor to inhibit the motion of magnetic flux lines. Such motion dissipates energy and creates resistance to electrical current. This negates the benefit of superconductivity and needs to be overcome. Various features have been shown to enhance the current carrying capacity of HTS materials in a magnetic field, e.g., features such as chemical impurities or interruptions in the crystalline structure of the superconductive material.

The use of surface particles has been used in attempts to enhance defects density in YBCO (see, e.g., Huijbregtse et al., Phys. Rev. B, vol. 62, pp. 1338-1349 (2000)) wherein surface particles were added in a separate deposition step thereby adding to the production cost. Similarly, Crisan et al., App. Phys. Lett., vol. 79, no. 27, pp. 4547-4549 (2001) describe sputtering of metallic nanodots of, e.g., silver, onto strontium titanate substrates prior to deposition of superconducting thin films. Also, Matsumoto et al., Physica C, vol. 412-414, pp. 1267-1271 (2004) describe introduction of nanoscale sized yttrium oxide islands onto strontium titanate substrates prior to deposition of superconducting thin films. In a variant process, Nie et al., Supercond. Sci. Technol., vol. 17, pp. 845-852 (2004) describe high temperature processing of a deposited cerium oxide buffer layer to generate cerium oxide nanodots at the buffer surface prior to deposition of superconducting thin films.

After careful experimentation by the present inventors, it has surprisingly been found that the production of beneficial flux-pinning defects in a YBCO layer can be enhanced by modification of the deposition conditions for selected underlying buffer layers. For example, when employing a strontium titanate (STO) buffer layer between the underlying substrate and the YBCO layer, deposition conditions for the buffer layer exist that result in different surface morphologies for the buffer layer. One example of such deposition conditions for the STO buffer is deposition at temperatures lower than would be optimum for production of the highest self-field critical current density ($J_c$).

It is an object of the present invention to improve the in-field performance of HTS materials, especially thin film YBCO structures. By "in-field" is meant in the presence of an applied magnetic field, whereas the term "self-field" refers to in the absence of an applied magnetic field.

SUMMARY OF THE INVENTION

In accordance with the purposes of the present invention, as embodied and broadly described herein, the present invention provides an article including a base substrate including a layer of an oriented cubic oxide material having a rock-salt-like structure thereon, and, a buffer layer upon the oriented cubic oxide material having a rock-salt-like structure layer, the buffer layer having an outwardly facing surface with a surface morphology including particulate outgrowths of from 10 nm to 500 nm in size at said surface, said particulate outgrowths having a surface density characterized as sufficiently high so as to yield a higher $J_c$ in any adjacent high temperature superconductive oxide material under in-field conditions in comparison to a similar high temperature superconductive oxide material in the absence of such a surface density of said particulate outgrowths, said surface density further characterized as insufficient in magnitude so as to yield a significant reduction in $J_c$ at self-field. In one embodiment, the buffer layer is of strontium titanate.

The present invention further provides a process of improving performance within magnetic fields of a high temperature superconductor by forming a buffer layer upon a base substrate including a layer of an oriented cubic oxide material having a rock-salt-like structure layer thereon, said buffer layer having an outwardly facing surface with a surface morphology including particulate outgrowths of from 10 nm to 500 nm in size at said surface, said particulate outgrowths having a surface density characterized as sufficiently high so as to yield a higher $J_c$ in any adjacent high temperature superconductive oxide material under in-field conditions in comparison to a similar high temperature superconductive oxide material in the absence of such a surface density of said particulate outgrowths, said surface density further characterized as insufficient in magnitude so as to yield a significant reduction in $J_c$ at self-field; and, forming a layer of a high temperature superconductive oxide material upon said buffer layer.

DETAILED DESCRIPTION

Figure 1:
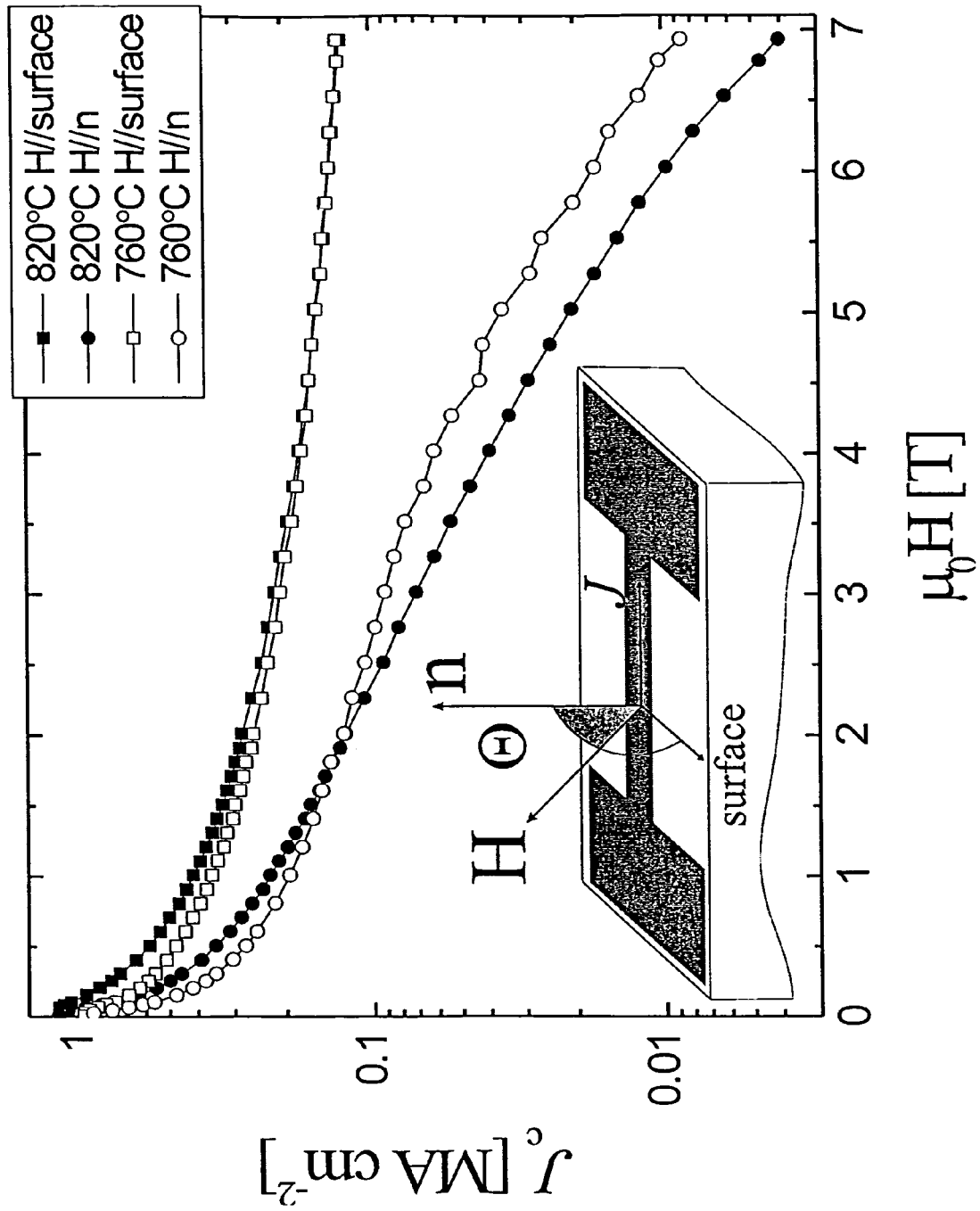
FIG. 1 shows a graph plotting critical current density ($J_c$) against magnetic field applied perpendicular to the superconducting film surface under different deposition conditions for an underlying buffer layer. The insert shows a sketch of the sample and the measurement setup.

The present invention is concerned with coated conductors, generally including a high temperature superconductive oxide material such as a YBCO superconductor. In particular, the present invention is concerned with improving the performance of the high temperature superconductors within a magnetic field, i.e., in-field. The present invention allows improvement of the in-field performance of HTS materials without the need for additional steps.

The term "coated conductor" refers to flexible composite structures including a high temperature superconducting layer.

In the present invention, the production of beneficial flux-pinning defects in a superconductor layer results from careful control and selection of the deposition conditions for an underlying buffer layer. The underlying buffer layer can generally be of a material such as a perovskite oxide or a cubic oxide. Suitable perovskite oxide materials can include strontium titanate, strontium ruthenate, mixtures or blends of strontium titanate and strontium ruthenate, lanthanum manganate and the like. Suitable cubic oxide materials include hafnium oxide and niobium oxide. Among perovskite oxide materials, the underlying buffer layer is preferably of strontium titanate. Titanium nitride may also be employed as the buffer layer. It has been found that different deposition temperatures for the buffer layer produce different surface morphologies for the buffer layer. Other deposition conditions that may be varied can include the thickness of the buffer layer, the choice of underlying material, the rate of deposition, and growth back pressure. In one embodiment, the surface morphology of a strontium titanate layer can be populated with outgrowths of the buffer material (generally in the form of particles of a size from about 10 nanometers (nm) to 500 nm) by deposition at temperatures from about 650° C. to about 750° C., while in contrast the buffer layer surface is generally smoother at other deposition temperatures (generally above about 750° C.). For a buffer of strontium titanate, it has been found that lower deposition temperatures of about 650° C. to about 750° C., more preferably from about 670° C. to about 730° C. can generate the beneficial particulate outgrowths or dislocations.

Interestingly, the presence of such particulate outgrowths or particles on the buffer surface is detrimental for self-field critical current density while being advantageous for in-field critical current density. In accordance with this realization, the present invention involves the intentional generation of extra flux-pinning correlated defects in a high temperature superconducting material by control of the deposition conditions of the underlying buffer layer, e.g., strontium titanate, strontium ruthenate, hafnium oxide or other suitable buffer layers. This process does not involve the addition of a secondary material or require secondary steps as in the addition of yttrium oxide precipitates to a HTS layer.

In the present invention, it is desired that the buffer layer having an outwardly facing surface with a surface morphology including particulate outgrowths of from 10 nm to 500 nm in size. Preferably, the particulate outgrowths will have a surface density sufficiently high so as to yield a higher JC in a subsequently deposited high temperature superconductive oxide material under in-field conditions. This is in comparison to a similar high temperature superconductive oxide material in the absence of such a surface density of said particulate outgrowths. The surface density of particulate outgrowths is further characterized as insufficient in magnitude so as to yield a significant reduction in $J_c$ at self-field. By "significant reduction in $J_c$" is meant a reduction to less than about 50 percent of unreduced value.

In the present invention, the high temperature superconducting material is generally an oxide material such as YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals as a substitute for some or all of the yttrium, may also be used. Other superconducting materials such as bismuth and thallium based superconductor materials may also be employed. $YBa_2Cu_3O_{7-\delta}$ is generally preferred as the superconducting material. YBCO typically has a superconducting transition temperature of from about 87K to 92K and such temperatures are presently generally considered as "high temperature" for superconductive materials as it allows the use of liquid nitrogen as the coolant.

In addition to the control of particulate outgrowths such as described in the present invention for improving vortex pinning, separate addition of selected particulate materials to the high temperature superconducting material may still further enhance flux pinning properties. Such particulate materials can be of barium zirconate, yttrium barium zirconate, yttrium oxide, and the like. The particulates are preferably sizes from about 5 nanometers to about 100 nanometers and are generally present in amounts of from about 1 to about 20 weight percent.

In the present invention, an article is provided including a base substrate including a layer of an oriented cubic oxide material having a rock-salt-like structure thereon, and a buffer layer upon the layer of an oriented cubic oxide material having a rock-salt-like structure. One or more structural layers can be placed between the base substrate and the layer of an oriented cubic oxide material having a rock-salt-like structure. Such structural layers can include a layer of an inert material such as aluminum oxide ($Al_2O_3$) and the like upon the base substrate and a layer of an oxide or oxynitride material such as $Y_2O_3$, AlON and the like on the layer of an inert material, thus forming a composite base substrate. Upon such a composite base substrate can be deposited the layer of an oriented cubic oxide material having a rock-salt-like structure. Preferably, the layer of an oriented cubic oxide material having a rock-salt-like structure is deposited by ion beam assisted deposition as is now commonly referred to as IBAD. An additional epitaxial layer, e.g., a homoepitaxial layer of the same oriented cubic oxide material having a rock-salt-like structure or an epitaxial layer of another oriented cubic material, e.g., a cubic oxide or a cubic nitride such as TiN, having a rock-salt-like structure, can be deposited, by sputtering, pulsed laser deposition and the like, onto an initial IBAD layer.

High temperature superconducting layers, e.g., a YBCO layer, can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, atomic layer deposition (a CVD process), molecular beam epitaxy, a sol-gel process, liquid phase epitaxy and the like. In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nm), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 10 Torr, preferably from about 100 to about 300 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam can have dimensions of about 1 millimeter (mm) by 4 mm with an average energy density of from about 1 to 4 joules per square centimeter ($J/cm^2$). After deposition, the films generally are cooled within an oxygen atmosphere of greater than about 100 Torr to room temperature.

The thin films of high temperature superconducting materials are generally from about 0.2 microns to about 10 microns in thickness, more preferably in the range of from about 0.5 μm to about 5 μm.

In the present invention, the high temperature superconducting material can be upon any suitable base substrate. For coated conductors of a high temperature superconducting material such as YBCO, the base substrate can be, e.g., a polycrystalline material such as polycrystalline metals or polycrystalline ceramics or can be a single crystal base substrate such as lanthanum aluminum oxide, aluminum oxide, magnesium oxide and the like. Also, the initial or base substrate can be an amorphous substrate such as silica or glass. In one embodiment, the base substrate can be a polycrystalline metal such as a metal alloy. Nickel-based alloys such as various Hastelloy metals, Haynes metals and Inconel metals are useful as the base substrate. Iron-based substrates such as steels and stainless steels may be used as the base substrate. Copper-based substrates such as copper-beryllium alloys may also be useful as the base substrate. In one embodiment, the base substrate can be a polycrystalline ceramic such as polycrystalline aluminum oxide, polycrystalline yttria-stabilized zirconia (YSZ), forsterite, yttrium-iron-garnet (YIG), silica and the like.

The ultimate application can determine the selection of the material for the base substrate. For example, the selection of the base substrate on which subsequent superconducting material (e.g., YBCO) is deposited can allow for the resultant article to be flexible whereby superconducting articles (e.g., coils, motors or magnets) can be shaped. Thus, for superconducting applications requiring flexible substrates, the base substrate is generally a polycrystalline metal as these materials are usually flexible, i.e., they can be, shaped. For other applications, the base substrate on which other oriented materials are deposited may be polycrystalline ceramics, either flexible or non-flexible. For still other applications, the base substrate may be a single crystal substrate such as magnesium oxide, lanthanum aluminate, or aluminum oxide.

The present invention is more particularly described in the following examples that are intended as illustrative only, since numerous modifications and variations will be apparent to those skilled in the art.

X-ray diffraction analysis including normal θ to 2θ scan, Φ can and rocking curve, were performed. Scanning electron microscopy (SEM) and atomic force microscopy (AFM) were used to study the surface morphology and roughness of as-grown YBCO films and STO buffer layers for various deposition conditions. Cross-sectional microstructure studies of the as-deposited films, including selected area diffraction (SAD), transmission electron microscopy (TEM) and high resolution TEM, were performed with a JEOL-3000F analytical electron microscope with point-to-point resolution of 0.17 nm.

The critical temperature ($T_c$) was measured inductively. Transport $J_c$ measurements were performed on bridges using a four-probe technique and 1 μV/cm voltage criterion, with the films immersed in liquid $N_2$ (75.5 K). The samples were rotated in a way that H was always perpendicular to the current (see insert of FIG. 1), in order to assure a maximum Lorentz force configuration (J⊥H). The angle Θ between H and the normal to the films (which coincides with the crystallographic c axis) was determined to better than 0.1°.

Example 1

A series of coated conductors were formed with the following structure: a Hastelloy base substrate/a layer of aluminum oxide ($Al_2O_3$)/a layer of yttrium oxide ($Y_2O_3$)/a layer of IBAD-MgO/a homoepitaxial layer of MgO/a layer of strontium titanate (STO)/a layer of YBCO (1 to 5 microns). The layer of STO was deposited by pulsed laser deposition using conditions for such deposition as described by Wang et al., J. Mater. Res., v. 19, no. 6, pp. 1869-1875 (2004), such reference incorporated herein by reference. Deposition temperature was varied from 670° C. to 860° C. at constant oxygen pressure of 300 milliTorr. From this structure, the measured properties of the YBCO layer was: a superconducting transition temperature ($T_c$) of 89 K, and a critical current density ($J_c$) of 1.0 $MA/cm^2$ with YBCO thickness at 4.0 μm.

Figure 2:
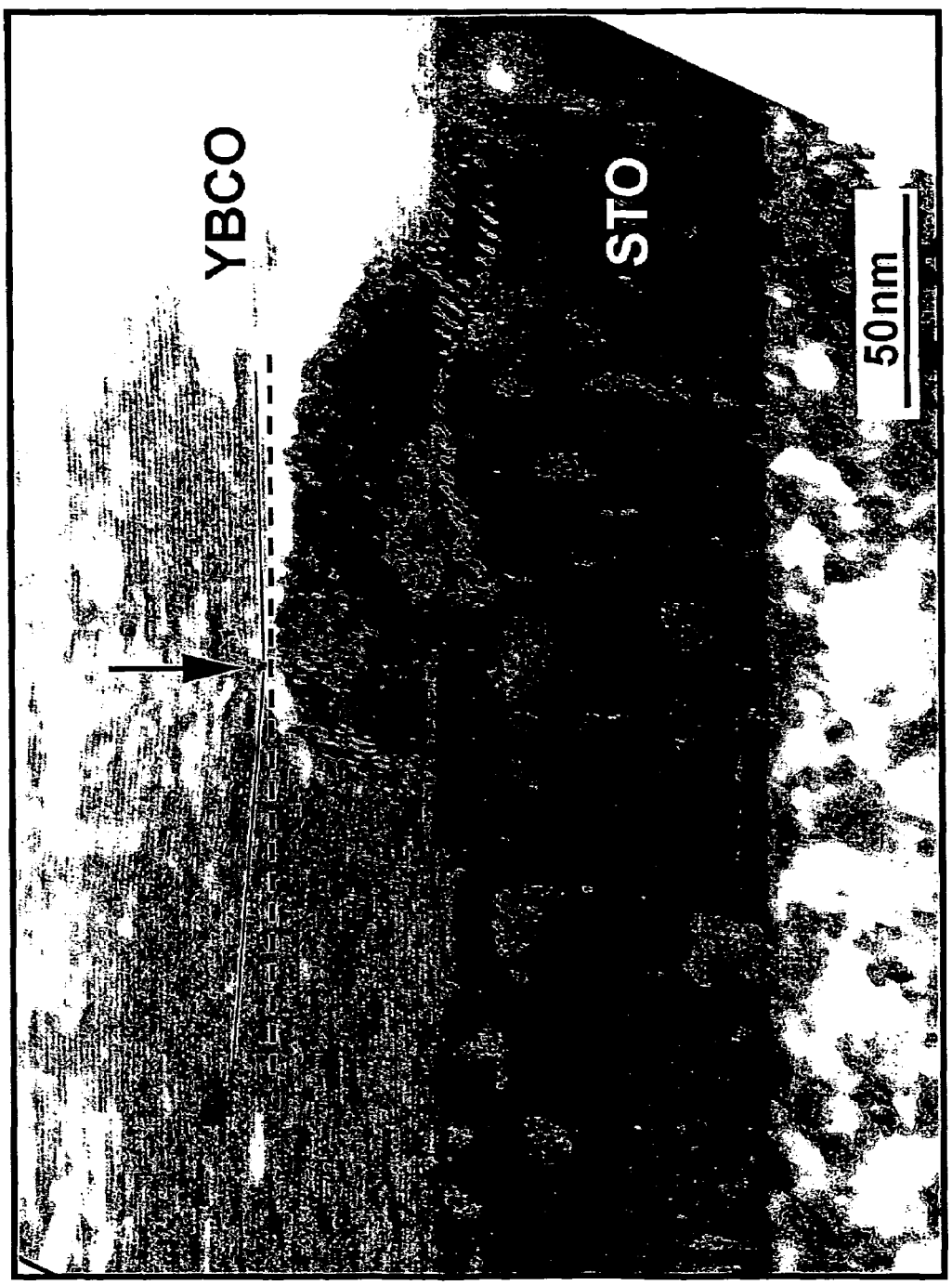
FIG. 2 shows scanning electron micrographs of a strontium titanate (STO) surface following deposition at varying deposition temperatures where it is seen that more STO outgrowths were generated at lower deposition temperatures.
Figure 3:
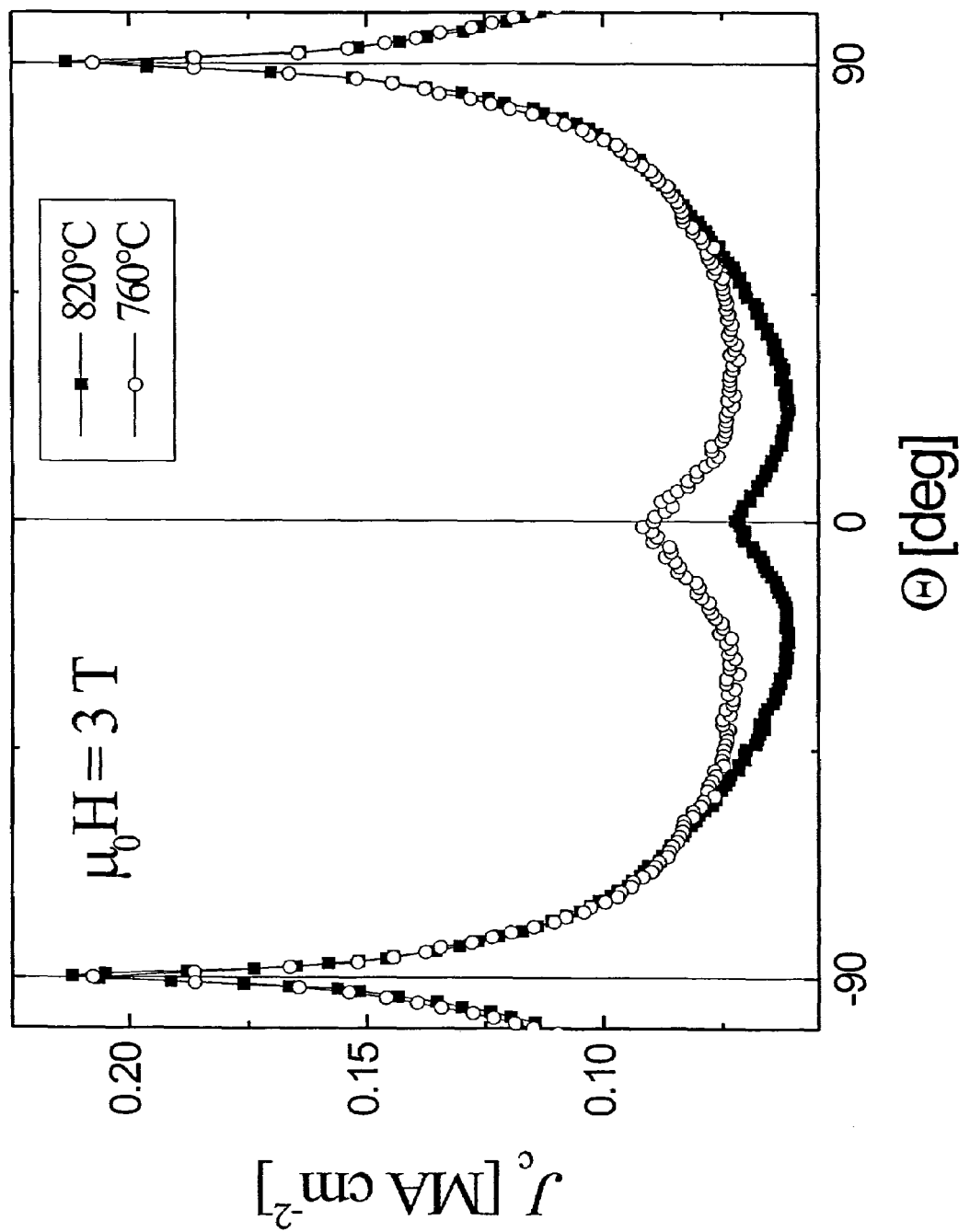
FIG. 3 shows angular dependence of $J_c$ as $J_c$ is plotted against angle ($\Theta$) between the normal (n) and the applied magnetic field of 3 Tesla.
Figure 4A:
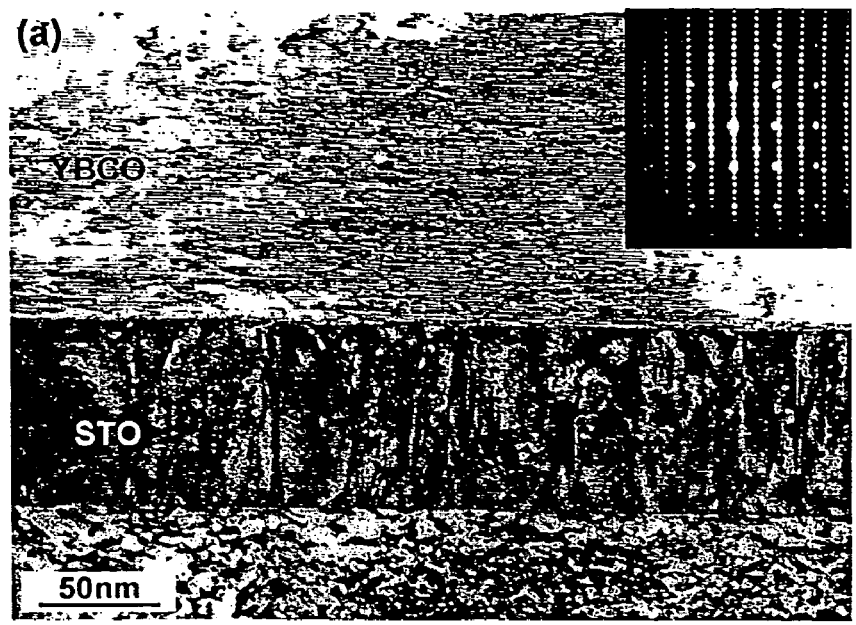
FIGS. 4(a) and (b) show cross sectional low magnification bright field transmission electron micrograph images of YBCO on MgO (100) substrates with a STO buffer layer deposited at 820° C. and 670° C. An STO outgrowth is clearly visible in (b) where a lower STO deposition temperature was employed.
Figure 4B:
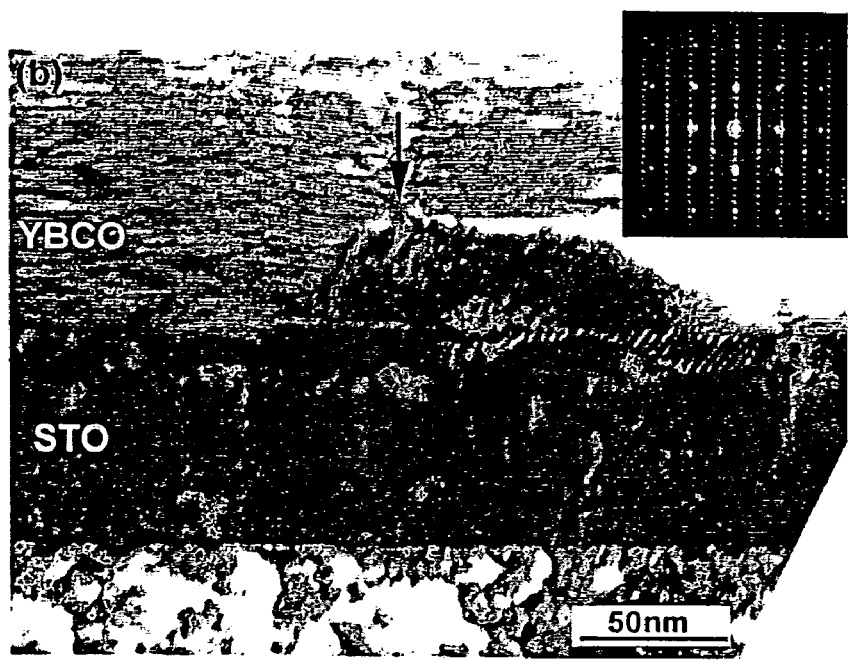

FIG. 2 shows the SEM for depositions at varying temperatures. It was found that the number of particulate outgrowths were greater at the lower temperatures. It was found that although for self-field $J_c$ the strontium titanate particulate outgrowths were detrimental, it was further found that in-field $J_c$ was better when the buffer layer was deposited at lower temperatures at which the particulate outgrowths were greater in number (as seen in FIG. 1).

Although the present invention has been described with reference to specific details, it is not intended that such details should be regarded as limitations upon the scope of the invention, except as and to the extent that they are included in the accompanying claims.

What is claimed is:

1. An article comprising:
   a base substrate including a layer of an oriented cubic oxide material having a rock-salt-like structure layer thereon; and,
   a buffer layer upon the oriented cubic oxide material having a rock-salt-like structure layer, the buffer layer having an outwardly facing surface with a surface morphology including particulate outgrowths of from 10 nm to 500 nm in size and composed of the same material as said buffer layer at said surface, said particulate outgrowths having a surface density characterized as sufficiently high so as to yield a higher Jc in any adjacent high temperature superconductive oxide material under in-field conditions in comparison to a similar high temperature superconductive oxide material in the absence of such a surface density of said particulate outgrowths, said surface density further characterized as insufficient in magnitude so as to yield a significant reduction in Jc at self-field.

2. The article of claim 1 wherein the layer of an oriented cubic oxide material having a rock-salt-like structure is of magnesium oxide.

3. The article of claim 1 wherein the layer of an oriented cubic oxide material having a rock-salt-like structure includes a first layer deposited by ion beam assisted deposition and an epitaxial layer deposited on the first layer.

4. The article of claim 3 wherein the layer of an oriented cubic oxide material having a rock-salt-like structure is of magnesium oxide.

5. The article of claim 1 wherein the base substrate is a flexible polycrystalline metal.

6. The article of claim 1 wherein the buffer layer has a thickness of from about 10 nanometers to about 100 nanometers.

7. The article of claim 1 wherein the base substrate further includes an inert oxide material layer between the base substrate and the layer of an oriented cubic oxide material having a rock-salt-like structure.

8. The article of claim 1 wherein the base substrate further includes an inert oxide material layer selected from the group consisting of aluminum oxide, erbium oxide, and yttrium oxide on the base substrate, and a layer of an oxide or oxynitride material upon the inert oxide material layer and the layer of an oriented cubic oxide material having a rock-salt-like structure is upon the layer of an oxide or oxynitride material.

9. The article of claim 7 wherein the inert oxide material layer is selected from the group consisting of aluminum oxide, erbium oxide, and yttrium oxide.

10. The article of claim 8 wherein the oxide or oxynitride material layer is selected from the group consisting of yttrium oxide, aluminum oxynitride, erbium oxide, yttria-stabilized zirconia, cerium oxide and europium oxide.

11. The article of claim 1 further including a layer of a high temperature superconductive oxide material upon outwardly facing surface of the buffer layer.

12. The article of claim 11 wherein the high temperature superconductive oxide material is a yttrium barium copper oxide (YBCO).

13. The article of claim 1 wherein the buffer layer is of a material selected from the group consisting of perovskite oxides and cubic oxides.

14. The article of claim 1 wherein the buffer layer is a cubic oxide material selected from the group consisting of hafnium oxide and niobium oxide.

15. The article of claim 1 wherein the buffer layer is of a material selected from the group consisting of strontium titanate, strontium ruthenate, a blend of strontium titanate and strontium ruthenate, lanthanum manganate and titanium nitride.

16. The article of claim 6 wherein the buffer layer is of strontium titanate.

17. The article of claim 11 wherein the buffer layer is of strontium titanate.

18. The article of claim 12 wherein the buffer layer is of strontium titanate.

19. The article of claim 12 wherein said YBCO includes flux pinning particulates therein.

20. The article of claim 19 wherein the flux pinning particulates are of barium zirconate.

21. A process of improving performance within magnetic fields of a high temperature superconductor comprising:
    forming a buffer layer upon a base substrate including a layer of an oriented cubic oxide material having a rock-salt-like structure layer thereon, said buffer layer having an outwardly facing surface with a surface morphology including particulate outgrowths of from 10 nm to 500 nm in size and composed of the same material as said buffer layer at said surface, said particulate outgrowths having a surface density characterized as sufficiently high to yield a higher Jc in any adjacent high temperature superconductive oxide material under in-field conditions in comparison to a similar high temperature superconductive oxide material in the absence of such a surface density of said particulate outgrowths, said surface density further characterized as insufficient in magnitude so as to yield a significant reduction in Jc at self-field; and,
    forming a layer of a high temperature superconductive oxide material upon said buffer layer.

22. The process of claim 21 wherein said high temperature superconductive oxide material is a yttrium barium copper oxide (YBCO).

23. The process of claim 21 wherein said forming of said buffer layers is under deposition conditions yielding enhanced levels of said particulate outgrowths.

\* \* \* \* \*